US009035252B2

(12) United States Patent
Yamamura

(10) Patent No.: US 9,035,252 B2
(45) Date of Patent: May 19, 2015

(54) DETECTION CIRCUIT, SENSOR DEVICE, AND ELECTRONIC APPARATUS

(75) Inventor: Mitsuhiro Yamamura, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 450 days.

(21) Appl. No.: 13/277,695

(22) Filed: Oct. 20, 2011

(65) Prior Publication Data

US 2012/0132808 A1    May 31, 2012

(30) Foreign Application Priority Data

Nov. 29, 2010    (JP) ................... 2010-265639

(51) Int. Cl.
  *G01J 5/34*    (2006.01)
  *G01J 1/44*    (2006.01)
  *H01L 37/02*    (2006.01)
  *G08B 13/191*    (2006.01)

(52) U.S. Cl.
  CPC ..... *G01J 5/34* (2013.01); *G01J 1/44* (2013.01)

(58) Field of Classification Search
  CPC .............. G01J 5/34; G01J 1/44; H01L 37/02; G08B 13/191
  USPC ...................................................... 250/338.3
  See application file for complete search history.

(56) References Cited

U.S. PATENT DOCUMENTS

| | | | | |
|---|---|---|---|---|
| 3,856,989 A | * | 12/1974 | Weimer | 348/318 |
| 4,115,692 A | * | 9/1978 | Balcerak et al. | 250/338.3 |
| 4,902,894 A | * | 2/1990 | Butler et al. | 250/338.1 |
| 6,635,495 B2 | * | 10/2003 | Hashimoto et al. | 438/3 |
| 7,847,252 B2 | | 12/2010 | Kawakubo et al. | |
| 2001/0030704 A1 | | 10/2001 | Kimura | |
| 2007/0126904 A1 | | 6/2007 | Kimura | |
| 2011/0018041 A1 | | 1/2011 | Kimura | |
| 2012/0256241 A1 | | 10/2012 | Kimura | |
| 2013/0129050 A1 | | 5/2013 | Kimura | |
| 2014/0217287 A1 | | 8/2014 | Kimura | |

FOREIGN PATENT DOCUMENTS

| | | |
|---|---|---|
| JP | 02-206284 A | 8/1990 |
| JP | 02-287224 A | 11/1990 |
| JP | 08-005454 A | 1/1996 |
| JP | 08-008721 A | 1/1996 |
| JP | 2001-298663 A | 10/2001 |
| JP | 2001-332944 A | 11/2001 |
| JP | 2002-135066 A | 5/2002 |
| JP | 2009-068863 A | 4/2009 |

OTHER PUBLICATIONS

Daisuke Akai et al., "Pyroelectric infrared sensors with fast response time and high sensitivity using epitaxial PbZr, TiO3 films on epitaxial γ-Al2O3/Si substrates", Sensors and Actuators A: Physical, vols. 130-131, Aug. 14, 2006, pp. 111-115, Elsevier Science B.V.

* cited by examiner

*Primary Examiner* — David Porta
*Assistant Examiner* — Mindy Vu
(74) *Attorney, Agent, or Firm* — Global IP Counselors, LLP

(57) ABSTRACT

A detection circuit includes a pyroelectric element; a first P-type transistor provided between an output node and a low-potential-side power node of the detection circuit, a detection signal being inputted from the pyroelectric element to a gate of the first P-type transistor; and a second P-type transistor provided between a high-potential-side power node and the output node, a gate of the second P-type transistor being set to a reference voltage.

21 Claims, 13 Drawing Sheets

DETECTION CIRCUIT, SENSOR DEVICE, AND ELECTRONIC APPARATUS

CROSS-REFERENCE TO RELATED APPLICATIONS

This application claims priority to Japanese Patent Application No. 2010-265639 filed on Nov. 29, 2010. The entire disclosure of Japanese Patent Application No. 2010-265639 is hereby incorporated herein by reference.

BACKGROUND

1. Technical Field

The present invention relates to a detection circuit, a sensor device, an electronic apparatus, and the like.

2. Related Art

Infrared detection circuits in which pyroelectric elements or the like are employed are conventionally well-known. For example, infrared rays having wavelengths near 10 μm radiate from the human body, and detecting these rays allows information about the presence and temperature of a human body to be acquired without physical contact. Using such an infrared detection circuit therefore allows intrusion detection or measurements of physical quantities to be implemented.

The technology disclosed in the following publications is well-known for infrared detection circuits. In a non-patent publication, "*Pyroelectric infrared sensors with fast response time and high sensitivity using epitaxial PbZr, TiO3 films on epitaxial γ-Al2O3/Si substrates*" (Daisuke Akai et al., Sensors and Actuators A: Physical, Volumes 130-131, 14 Aug. 2006, Pages 111-115, Elsevier Science B. V.), a source follower circuit, which is configured from a transistor (JFET) and a resistor connected in series, is used to detect the pyroelectric current of a pyroelectric element.

In Japanese Laid-Open Patent Application No. 2009-68863, a P-type transistor that functions as a load element and an N-type transistor that functions as an amplifier element are connected in series, whereby a common-source amplifier circuit is configured, and this common-source amplifier circuit is used to detect the pyroelectric current of a pyroelectric element.

SUMMARY

However, problems have been presented in the prior art in that variations in the characteristics of the resistors, transistors, and other circuit elements that constitute the detection circuit cause extremely large variations in the output voltage of the detection circuit.

According to aspects of the present invention, there can be provided a detection circuit, a sensor device, an electronic apparatus, and the like that can reduce variation in output voltage caused by variation in element characteristics.

One aspect of the present invention relates to a detection circuit including a pyroelectric element, a first P-type transistor provided between an output node and a low-potential-side power node of the detection circuit so that a detection signal is inputted from the pyroelectric element to a gate of the first P-type transistor, and a second P-type transistor provided between a high-potential-side power node and the output node, a gate of the second P-type transistor being set to a reference voltage.

According to this aspect of the present invention, there is provided a pyroelectric element; a first P-type transistor, a detection signal being inputted from the pyroelectric element to a gate of the first P-type transistor; and a second P-type transistor, a gate of the second P-type transistor being set to a reference voltage. A source follower circuit is configured from the first and second P-type transistors, and an output voltage that corresponds to the detection signal inputted to the gate of the first P-type transistor is outputted to the output node. According to the detection circuit having such a configuration, the effects of characteristic variations in the threshold voltage and the like of the first and second P-type transistors on the output voltage can be minimized, and therefore variations in the output voltage caused by variations in the element characteristics can be reduced.

According to another aspect of the present invention, a substrate potential of the first P-type transistor is preferably set to a potential of a source of the first P-type transistor, and a substrate potential of the second P-type transistor is preferably set to a potential of a source of the second P-type transistor.

Fluctuations in the threshold voltages of the first and second P-type transistors due to substrate bias effects can thus be prevented, and variation in the output voltage can therefore be further reduced.

According to another aspect of the present invention, at least one of a gate length and a gate width is preferably the same for the first P-type transistor and the second P-type transistor.

The threshold voltages and other element characteristics of the first and second P-type transistors can thus be brought closer together, and variation in the output voltage can therefore be further reduced.

According to another aspect of the present invention, the first P-type transistor and the second P-type transistor are preferably laid out to be adjacent to each other.

If such a layout is used, variation in the element characteristics of the first and second P-type transistors resulting from fluctuations in manufacturing processes and the like can thus be reduced, and variation in the output voltage can therefore be further reduced.

According to another aspect of the present invention, the second P-type transistor is preferably shared with a detection circuit for another pyroelectric element.

If the second P-type transistor is thus shared, e.g., the layout surface area of the transistors can be reduced.

According to another aspect of the present invention, a high-potential-side power voltage Vcc is preferably supplied to the high-potential-side power node, a voltage of the gate of the second P-type transistor is set to a value obtained by subtracting a voltage Vconst from the high-potential-side power voltage Vcc (Vcc-Vconst) as the reference voltage, the voltage outputted from the first P-type transistor changing according to a voltage change of the detection signal from the pyroelectric element with a set voltage corresponding to the voltage Vconst being used as a reference.

The output voltage of the detection circuit can thus be made to change using the set voltage that corresponds to the voltage Vconst as a reference.

According to another aspect of the present invention, preferably, Vth≤Vconst≤Vcc−Vth, where Vth is a threshold voltage of the first P-type transistor.

The first and second P-type transistors can thus be made to operate in the saturation region. The output voltage can also be set to be equal to or greater than the threshold voltage Vth, and, e.g., the design of subsequent-stage circuits can be simplified.

According to another aspect of the present invention, the detection circuit preferably further includes a voltage-adjusting circuit configured and arranged to adjust a drain-source voltage of the second P-type transistor, the voltage-adjusting circuit being provided between the second P-type transistor and the output node.

If the voltage-adjusting circuit is thus provided, the drain-source voltages of the first and second P-type transistors can be brought closer together, and the differences in the element characteristics of the first and second P-type transistors can be further reduced.

Another aspect of the present invention relates to a sensor device including any of the aforedescribed detection circuits.

Another aspect of the present invention relates to a sensor device including a sensor array having a plurality of sensor cells that are arrayed, a plurality of row lines, one or more column lines, a row-select circuit connected to the row lines, and a read circuit connected to the one or more column lines. Each of the sensor cells has a pyroelectric element, a first P-type transistor provided between a low-potential-side power node and an output node for a corresponding one of the one or more column lines so that a detection signal is inputted from the pyroelectric element to a gate of the first P-type transistor, and a second P-type transistor provided between a high-potential-side power node and the output node, a gate of the second P-type transistor being set to a reference voltage.

According to this other aspect of the present invention, each of the sensor cells is provided with a pyroelectric element; a first P-type transistor, a detection signal being inputted from the pyroelectric element to a gate of the first P-type transistor; and a second P-type transistor, a gate of the second P-type transistor being set to a reference voltage. A source follower circuit is configured from the first and second P-type transistors, and an output voltage that corresponds to the detection signal inputted to the gate of the first P-type transistor is outputted to the output node. According to the sensor device having such a configuration, the effects of characteristic variations in the threshold voltage and the like of the first and second P-type transistors on the output voltage can be minimized, and therefore variations in the output voltage from the sensor cells can be reduced.

Another aspect of the present invention relates to a sensor device including a sensor array having a plurality of sensor cells that are arrayed, a plurality of row lines, one or more column lines, a row-select circuit connected to the row lines, a read circuit connected to the one or more column lines, and a current-source circuit connected to the one or more column lines. Each of the sensor cells has a pyroelectric element, and a first P-type transistor provided between a low-potential-side power node and an output node for a corresponding one of the one or more column lines so that a detection signal is inputted from the pyroelectric element to a gate of the first P-type transistor. The current-source circuit has a second P-type transistor configured and arranged to supply current to each of the sensor cells via the corresponding one of the one or more column lines, the second P-type transistor being provided between a high-potential-side power node and the output node, and a gate of the second P-type transistor being set to a reference voltage.

According to this other aspect of the present invention, each of the sensor cells is provided with a pyroelectric element and a first P-type transistor, a detection signal being inputted from the pyroelectric element to a gate of the first P-type transistor. The current-source circuit is provided with a second P-type transistor corresponding to each of the corresponding column lines. A source follower circuit is configured from the first and second P-type transistors, and an output voltage that corresponds to the detection signal inputted to the gate of the first P-type transistor is outputted to the output node. According to the sensor device having such a configuration, the effects of characteristic variations in the threshold voltages and the like of the first and second P-type transistors on the output voltage can be minimized, and therefore variations in the output voltage from the sensor cells can be reduced.

According to another aspect of the present invention, each of the sensor cells preferably includes a row-select transistor provided between the output node and the corresponding one of the one or more column lines with a gate of the row-select transistor being connected to a corresponding one of the row lines, and each of the sensor cells among the sensor cells provided to correspond to the corresponding one of the one or more column lines is preferably connected to the corresponding one of the one or more column lines via the row-select transistor.

Using the corresponding row line to control the on and off states of the row-select transistor allows each of the sensor cells to be connected to the corresponding column line via the row-select transistor, and allows the output voltages to be read.

Another aspect of the present invention relates to an electronic apparatus comprising any of the aforedescribed detection circuits.

Another aspect of the present invention relates to an electronic apparatus comprising any of the aforedescribed sensor devices.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the present invention will be described in detail below. The present embodiment described below does not unduly limit the content of the present invention described in the claims, and not all of the configurations described in the present embodiment are necessarily the means for solving problems using the invention.

1. Comparative Example

The circuit configuration of the prior art of Non-Patent Citation 1 described above is shown in FIG. 1 as a comparative example. The detection circuit of the comparative example includes a pyroelectric element 10, an N-type depletion-mode transistor TN, and a resistor R.

"CP" is a capacitor of the pyroelectric element 10, and RP is the resistor of the pyroelectric element 10. Infrared rays impinge on the pyroelectric element 10, and spontaneous polarization occurs in a pyroelectric body (ferroelectric body) 11 of the pyroelectric element 10 according to the temperature of the pyroelectric element 10. Electrical neutrality relative to the surface charge of electrodes 12, 13 is maintained.

The N-type depletion-mode transistor TN and the resistor R are provided in series between a VCC node (broadly speaking, the power node on the high-potential side) and a GND node (broadly speaking, the power node on the low-potential side) to configure a source follower circuit.

A detection signal SD (detection voltage) is inputted from the pyroelectric element 10 to the gate of the N-type transistor TN. The source of the N-type transistor TN is connected to one end of the resistor R. The source follower circuit is configured from the transistor TN and the resistor R, and the gain thereof is approximately 1. An output voltage VQ that changes along with changes in the voltage of the detection signal SD is outputted from an output node NQ that corresponds to the source of the N-type transistor TN.

In particular, manufacturing variability such as that described below is a factor that causes variability in the output characteristics of the source follower circuit in the manufacturing of the detection circuit of the comparative example on an IC substrate. Examples of such variability include, e.g., variability in the current supply performance of the transistor TN, variability in threshold value, variability in shape, variability in the sheet-resistance value of the resistor R, and variability in the shape of the resistor R.

The characteristic variation of the resistors generally manufactured on IC substrates fluctuates widely in comparison with the characteristic variation of the transistor. The characteristic fluctuations of the resistor that depend on the fluctuations of the manufacturing conditions and the characteristic fluctuations of the transistor are not linked to each other. This results in extremely large characteristic variations in the output voltage VQ of the detection circuit according to the comparative example of FIG. 1.

Figure 2:
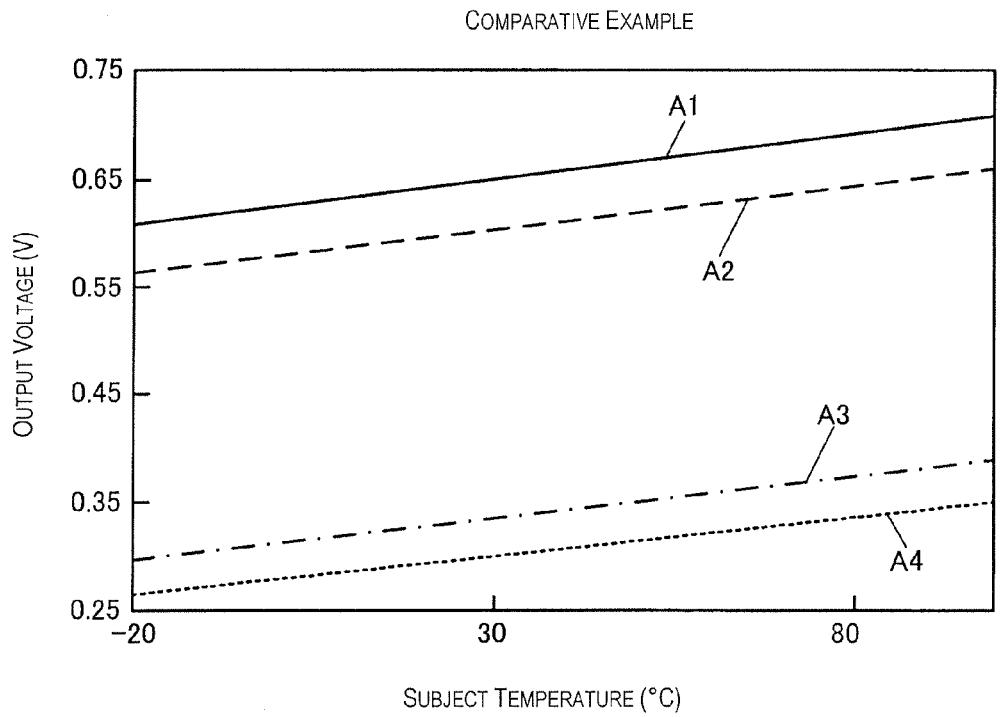
FIG. 2 is a characteristic example of subject temperature versus output voltage in the detection circuit of the comparative example.

For example, FIG. 2 shows a characteristic example of subject temperature versus output voltage when the detection circuit of the comparative example is used as an infrared detection circuit. The horizontal line in FIG. 2 is the subject temperature, and the vertical line is the output voltage VQ of the detection circuit when infrared rays produced by the subject are received. In FIGS. 2, A1, A2, A3, and A4 are four plots of the characteristics of the output voltage of the detection circuit when the characteristics of the transistor TN and the resistor R vary within general IC manufacturing standards.

Specifically, A1, A2, A3, and A4 in FIG. 2 are example characteristics of the relationship between subject temperature and output voltage for respective cases 1, 2, 3, and 4. In case 1, the characteristics are that a resistance value RV of the resistor R is high, a gate width W of the transistor TN is large, a gate length L is small, a threshold voltage Vth is low, and a gate film thickness FTC is narrow. In case 2, the characteristics are that RV is low, W is small, L is large, Vth is low, and FTC is narrow. In case 3, the characteristics are that RV is high, W is large, L is small, Vth is high, and FTC is wide. In case 4, the characteristics are that RV is low, W is small, L is large, Vth is high, and FTC is wide.

As shown by A1, A2, A3, and A4 in FIG. 2, in the detection circuit of the comparative example, the fluctuations in the output voltage VQ that are caused by variations in the element characteristics of the detection circuits are much larger than the dependency of the output voltage VQ on the subject temperature. Problems are therefore presented in that the detection precision of the detection circuit cannot be maintained.

Figure 1:
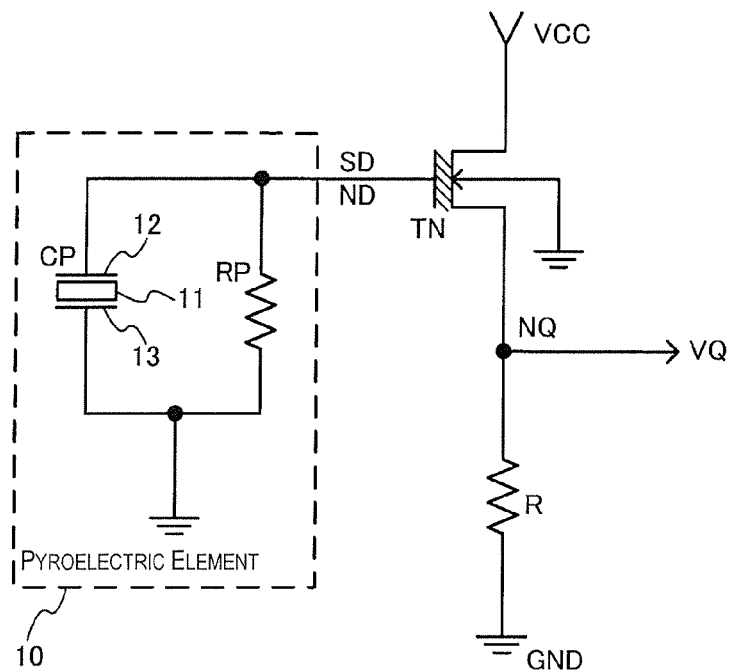
FIG. 1 is an illustrative diagram of a detection circuit of a comparative example.

In particular, when pyroelectric elements are positioned in a matrix and configured as a FPA (focal plane array), a plurality of detection circuits of FIG. 1 are positioned on the IC substrate. The outputs of the detection circuits are bundled via row-select transistors and the like and connected to an amplifier circuit and an A/D converter. When the changes in the output voltages caused by the characteristic variation of the detection circuits here are larger than the dependency of the output voltages of the detection circuits on the subject temperature, it becomes difficult to bundle the outputs of the plurality of detection circuits and amplify the signal in the amplifier circuit, or to convert the output voltages to digital data in the A/D converter. In other words, when the plurality of detection circuits are connected to one amplifier circuit and A/D converter, it is extremely difficult to produce a design that would allow the amplifier circuit and the A/D converter to operate stably with respect to all of the detection circuits having varied characteristics of output voltage. It is also extremely difficult to determine the intensity of the infrared rays irradiating the pyroelectric elements 10, and the temperature of the subject emitting the infrared rays.

The transistor TN must be stably "on" in order for the source follower circuit comprising the transistor TN and the resistor R of FIG. 1 to operate. The gate voltage of the transistor TN is approximately 0 V. Therefore, in order for the transistor TN to be "on," the design must be such that the source voltage of the transistor TN, i.e., the output voltage VQ of the detection circuit, is significantly lower than the absolute value of the threshold value of the transistor TN.

On the other hand, the amplifier circuit and the A/D converter that receive the output of the detection circuit are designed with small-size circuits connected to the GND terminal of the detection circuit and a GND terminal of the same potential in a CMOS process when a sensor array is formed on the IC substrate. When the input voltage of these circuits approaches 0 V (the potential of the GND terminal) in such instances, the performance of the circuit decreases, the circuit may stop functioning, or other problems may be presented.

2. Configuration and Operation of Detection Circuit

Figure 3:
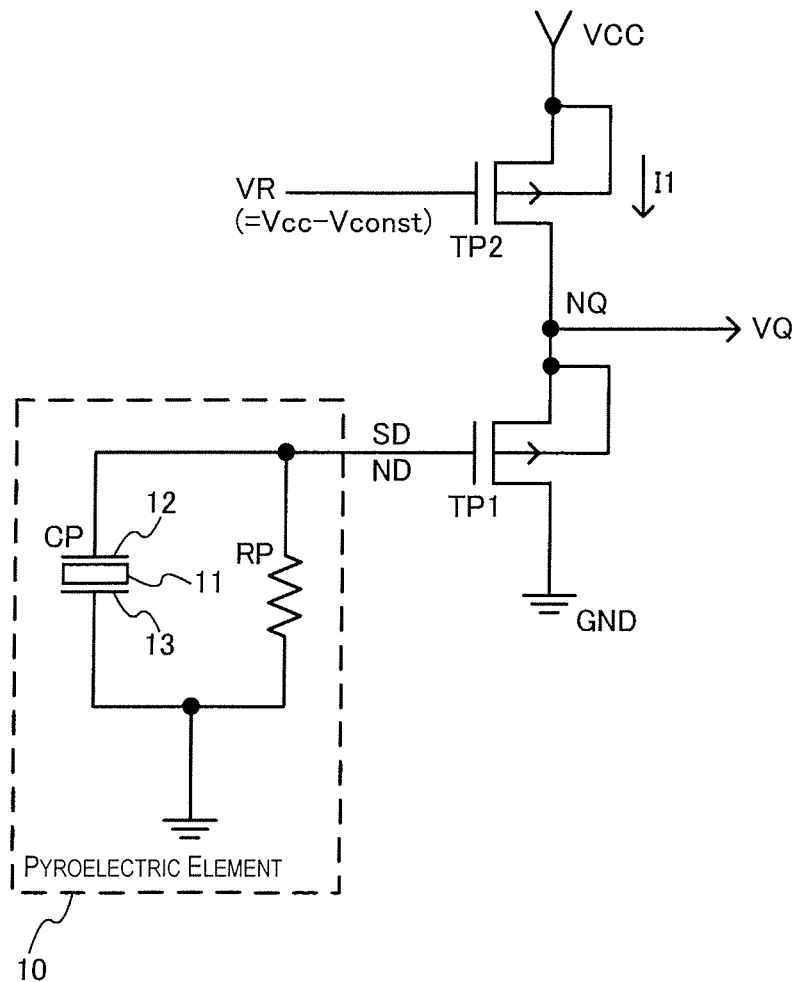
FIG. 3 is a configuration diagram of a detection circuit of the present embodiment.

An example configuration of a detection circuit according to the present embodiment for solving the aforedescribed problems is shown in FIG. 3. This detection circuit includes the pyroelectric element 10, and also includes a first P-type transistor TP1 and a second P-type transistor TP2 that are provided in series between the VCC and the GND. The source follower circuit is configured from these first and second P-type transistors TP1, TP2. In other words, a voltage of an amplitude having a gain of approximately 1 with respect to the change in small-signal amplitude of the detection signal SD is outputted as the output voltage VQ.

In the pyroelectric element 10 (heat-detecting element, infrared-detecting element, or sensor element), an equivalent circuit is configured from a capacitor CP and a resistor RP, and the pyroelectric body 11 of the pyroelectric element 10 is spontaneously polarized according to changes in temperature due to incident infrared rays.

The first P-type transistor TP1 (P-type MOS transistor) is provided between the output node NQ and the GND node (low-potential-side power node) of the detection circuit. For example, in FIG. 3, the source of TP1 is connected to the output node NQ, the drain is connected to the GND node, and the detection signal SD from the pyroelectric element 10 is inputted to the gate.

The second P-type transistor TP2 (P-type MOS transistor) is provided between the VCC node (high-potential-side power node) and the output node NQ. For example, in FIG. 3, the source of TP2 is connected to the VCC node, the drain is connected to the output node NQ, and the gate is set to a reference voltage VR, which equals Vcc−Vconst. "Vcc" represents the voltage of the high-potential-side power source VCC, and Vconst is a set voltage (fixed voltage).

Other circuit elements (e.g., voltage-adjusting circuits, row-select transistors, or the like described hereinafter) may also be provided between the P-type transistors TP1 and TP2.

The substrate potential of the P-type transistor TP1 is set to the potential of the source of TP1. For example, in FIG. 3, the substrate potential of TP1 is connected to the output node NQ. The substrate potential of the P-type transistor TP2 is set to the potential of the source of TP2. For example, in FIG. 3, the substrate potential of TP2 is connected to the VCC node. The substrate potentials of the P-type transistors TP1, TP2 are thus set to the source potentials thereof, whereby fluctuations in the threshold voltages of TP1, TP2 due to substrate bias effects can be prevented, and therefore the threshold voltages of TP1 and TP2 can be brought closer together. A modification in which the substrate potentials of the P-type transistors TP1, TP2 are both set to the potential of VCC is also possible.

At least one of the gate length and the gate width is the same for the P-type transistors TP1 and TP2. More preferably, both the gate length and the gate width are the same for TP1 and TP2. The threshold voltages and other element characteristics of the P-type transistors TP1 and TP2 can thus be brought closer together, and fluctuations in the output voltage VQ caused by fluctuations in the manufacturing process and the like can be minimized.

As described hereinafter, the P-type transistors TP1 and TP2 are preferably laid out in an adjoining fashion. Variation in the threshold voltages and other element characteristics of the P-type transistors TP1 and TP2 can thus be reduced, and therefore variation in the output voltage VQ can be further reduced.

In the adjoining layout, TP1 and TP2 are positioned, e.g., without other circuit elements (transistors, resistors, and the like) therebetween. The first P-type transistor TP1 may also be positioned adjoining the first P-type transistor of the detection circuit of another pyroelectric element. Similarly, the P-type transistor TP2 may also be positioned adjoining the second P-type transistor of the detection circuit of another pyroelectric element.

The P-type transistor TP2 may also be shared with the detection circuit of another pyroelectric element, as described hereinafter. In other words, the P-type transistor TP2 may be shared as a common current source for a plurality of detection circuits. The area occupied by the P-type transistor in the layout can thereby be kept to a minimum.

The operation of the detection circuit of the present embodiment will next be described in more detail. As shown in FIG. 3, the gate of the transistor TP2 is set to the reference voltage VR, which equals Vcc−Vconst. The gate-source voltage of the transistor TP2 is therefore Vconst. TP2 operates in the saturation region, and therefore a current I1, which is primarily determined only by the gate-source voltage Vconst and the threshold voltage, is made to flow to TP2.

The transistor TP1 is connected in series to the transistor TP2, and therefore the same current I1 flows to TP1. The substrate potential of the transistor TP1 is set to the source potential, in same manner as the transistor TP2. The threshold voltage of the transistor TP1 and the threshold voltage of the transistor TP2 can therefore be made equivalent. Assuming that the transistor TP1 operates in the saturation region and that the transistors TP1 and TP2 are the same size (the same gate width and gate length), the gate-source voltage of TP1 is substantially the same as Vconst, which is the gate-source voltage of TP2. The gate of the transistor TP1 is connected to the pyroelectric element 10, and the resistor RP of the pyroelectric element 10 is present between GND and the node ND of the gate of TP1, and therefore the node ND is always set to 0 V. The output voltage VQ of the output node NQ of the detection circuit, which output node is the source node of the transistor TP1, is therefore always set to substantially the same voltage as Vconst.

When the pyroelectric element 10 is irradiated with infrared rays in this state, and the temperature of the pyroelectric element 10 changes, the pyroelectric current that arises causes the gate (gate capacitor) of the transistor TP1 to be transiently charged, and the voltage fluctuates by $\Delta V$. The current I1 flows from the transistor TP2 to the transistor TP1 at this time, and therefore VQ, which is the source voltage of TP1, becomes equal to Vconst+$\Delta V$. In other words, the circuit composed of the transistors TP1, TP2 operates as a source follower circuit having a gain equal to one.

In the present embodiment as described above, when Vcc, which is the voltage of the high-potential-side power source, is supplied, the gate of the P-type transistor TP2 is set to the reference voltage VR, which equals Vcc−Vconst. The P-type transistor TP1 outputs to the source thereof a voltage that changes along with the voltage changes of the detection signal SD from the pyroelectric element 10, where a set voltage that corresponds to Vconst is used as a reference. When, e.g., the temperature of the pyroelectric element 10 changes, and the voltage of the detection signal SD changes from 0 V by $\Delta V$, the output voltage VQ also changes by $\Delta V$, where the set voltage corresponding to Vconst is used as a reference. The set voltage that corresponds to Vconst may be Vconst itself or may be slightly different from Vconst. In other words, when a voltage-adjusting circuit (described hereinafter), the setting of Vconst, or the like is used to set the source/gain voltages of the transistors TP1 and TP2 to the same value, the source-gain voltages of TP1 and TP2 are equivalent, and therefore the set voltage that corresponds to Vconst is Vconst itself. On the other hand, when the source-gain voltages of the transistors TP1 and TP2 are not the same, the set voltage of VQ will be offset by a corresponding amount.

When the threshold voltage of the P-type transistor TP2 (TP1) is Vth, the voltage Vconst is preferably set so that Vth≤Vconst≤Vcc−Vth. In other words, the reference voltage VR that results from this relationship and that equals Vcc−Vconst is inputted to the gate of the P-type transistor TP2. The transistors TP1, TP2 can thus be made to operate in the saturation region. Since Vconst, which is the set voltage of the output voltage VQ, is greater than or equal to the threshold voltage Vth, a voltage greater than or equal to the threshold voltage Vth can always be inputted to the amplifier circuit and A/D converter at a subsequent stage. The design of the subsequent-stage amplifier circuit and A/D converter can therefore be simplified, and a compact, simple circuit can be used as the amplifier circuit or the A/D converter.

Figure 4:
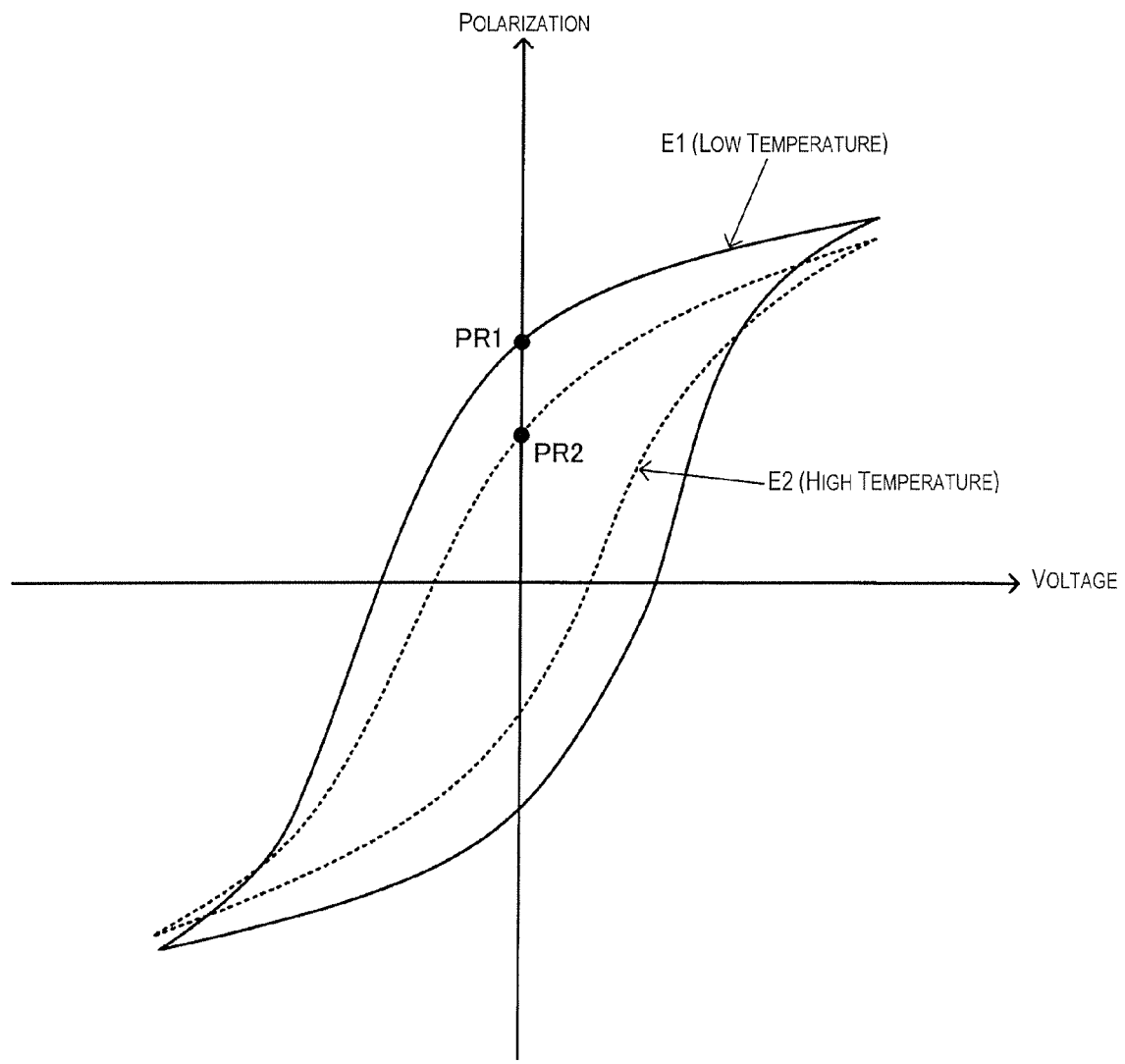
FIG. 4 is an example of a hysteresis loop of the pyroelectric element.

FIG. 4 shows an example of a hysteresis loop of the ferroelectric/pyroelectric element 10. E1 is the hysteresis loop at low temperature, and E2 is the hysteresis loop at high temperature. As shown in FIG. 4, a spontaneous polarization PR2 (residual polarization) in the hysteresis loop at high temperature is smaller than a spontaneous polarization PR1 at low temperature.

When infrared rays are irradiated and the temperature of the pyroelectric element 10 changes, the spontaneous polarization of the pyroelectric element 10 changes according to the amount of change in temperature. At this time, a transfer of the surface charge of the electrodes 12, 13 occurs so that the spontaneous polarization of the pyroelectric element 10 and the state of electrical neutrality are maintained, and a pyroelectric current is thereby produced. The magnitude of the pyroelectric current therefore depends on the amount of the change in temperature of the pyroelectric element 10. The pyroelectric current that is produced causes the gate (gate capacitor) of the transistor TP1 to be charged, and the ultimate voltage ($\Delta V$) of the detection signal SD of the pyroelectric element 10 to change. The ultimate voltage is therefore outputted as the output voltage VQ via the source follower circuit, which is composed of the transistors TP1, TP2 of FIG. 3 and has a gain of one, whereby the change in temperature of the pyroelectric element 10 due to infrared irradiation can be detected.

In the source follower circuit of the infrared detection circuit of the present embodiment as described above, a resistor having large characteristic variation, such as that in the comparative example of FIG. 1, need not be used as a load element. The two elements that constitute the source follower circuit are both P-type MOS transistors, and therefore the characteristic fluctuations of the two elements that depend on fluctuations in manufacturing conditions are linked, and the characteristic variation of the output voltage VQ of the detection circuit is small.

The substrate potentials of the transistors TP1, TP2 are connected to the respective source terminals. The threshold voltages of the transistors TP1, TP2 are therefore substantially equivalent, and the characteristic variation of the output voltage VQ of the detection circuit can therefore be further reduced.

The transistors TP1, TP2 also have the same size (gate length and gate width), and therefore the same current I1 flows to the transistors TP1, TP2, which are connected in series, and both transistors operate in the saturation region. Using the same transistor size allows the minute difference between the threshold voltages to be further reduced. The transistors TP1, TP2 therefore operate in a state in which all of the parameters other than, e.g., the source-drain voltage are substantially equivalent. The characteristic variation of the output voltage VQ of the detection circuit therefore decreases even further.

Figure 5:
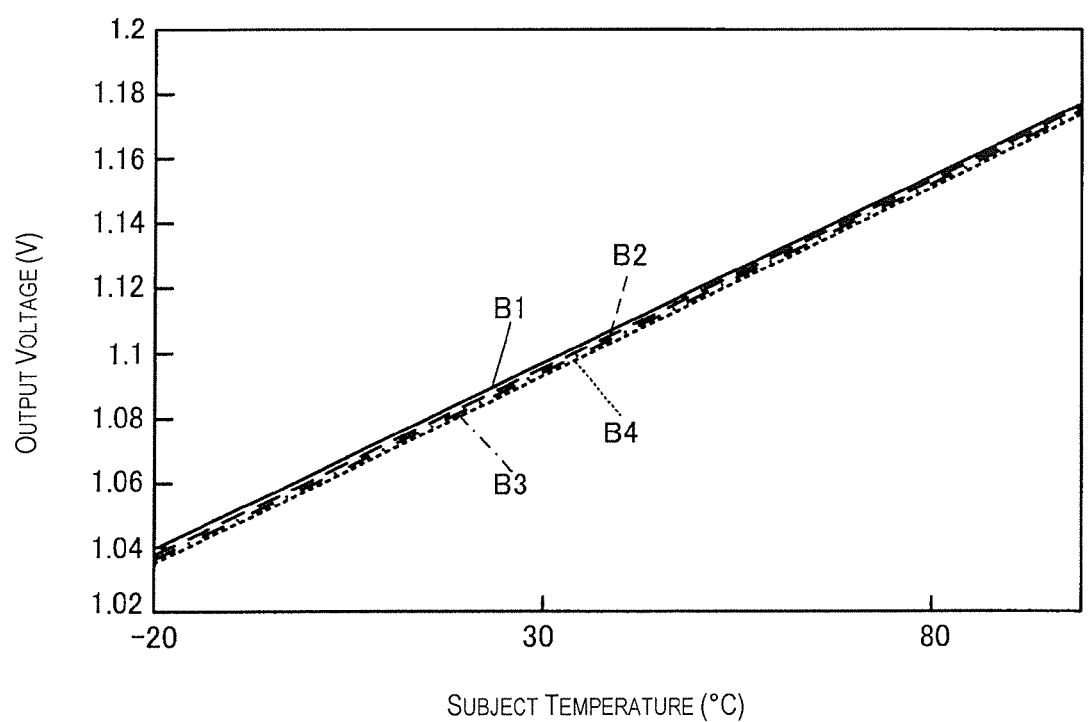
FIG. 5 is a characteristic example of subject temperature versus output voltage in the detection circuit of the present embodiment.

For example, FIG. 5 shows a characteristic example of subject temperature versus output voltage when the detection circuit of the present embodiment is used as an infrared-detecting circuit. In FIG. 5, B1, B2, B3, and B4 are four plots of the characteristics of the output voltage of the detection circuit when the characteristics of the transistors TP1, TP2 vary within general IC manufacturing standards. B1, B2, B3, and B4 in FIG. 5 correspond to cases of 1, 2, 3, and 4 of A1, A2, A3, and A4 in FIG. 2.

As can be understood from FIG. 5, in the detection circuit of the present embodiment, the changes in the output voltage resulting from the characteristic variation of the detection circuits are sufficiently small in relation to the dependence of the output voltage on the temperature of the subject. The amplifier circuit, A/D converter, and other circuits that take as input the output of the detection circuit of the present embodiment can therefore be designed so as to operate stably with respect to all of the plurality of connected detection circuits (circuits having varied characteristics). The design can therefore be simplified, and a compact, simple circuit can be used as the amplifier circuit or the A/D converter.

If the output voltage of the infrared detection circuit can be stabilized and acquired as digital data, the variation of the output voltages of the detection circuits will be within a range that can be adequately corrected for by software to make it possible to precisely determine the intensity of the infrared rays irradiating the pyroelectric elements 10 and the temperature of the subject emitting the infrared rays.

The transistors TP1, TP2 are laid out in an adjoining fashion, as described hereinafter, and therefore the characteristic variation of the two transistors TP1, TP2 is further reduced, and the characteristic variation of the output voltage of the detection circuit is also further reduced.

The constant voltage component Vconst of the reference voltage VR=Vcc−Vconst can be freely set by the designer in a range in which the transistors TP1, TP2 operate in the saturation region. The output voltage VQ of the detection circuit of the present embodiment can therefore be set to an adequately high voltage in comparison with the detection circuit of the comparative example of FIG. 1. Problems such as the input voltage approaching 0 V (the potential of GND) and causing the performance of the circuit to decrease or the circuit to stop functioning are therefore not presented in the amplifier circuits and A/D converter circuits that receive the output voltage of the detection circuit, and the circuits can be stably operated.

In the detection circuit of the aforedescribed Patent Citation 1, a common-source amplifier is configured from a P-type transistor and an N-type transistor connected in series. However, in a common-source amplifier having such a configuration, the threshold voltages of the P-type transistor and the N-type transistor do not balance out, and the output voltage of the detection circuit fluctuates as a result of the characteristic variations of the P-type transistor and the N-type transistor.

In contrast, in the detection circuit of the present embodiment, the threshold voltages of the P-type transistors TP1, TP2 do balance out, making it possible to minimize the effects of characteristic variations in the threshold voltages and the like on the variation of the output voltage. Therefore, in comparison with the detection circuit of Patent Citation 1, the variation in the output voltage can be reduced, and the precision of infrared detection and other properties can be improved.

3. Modification

Figure 6:
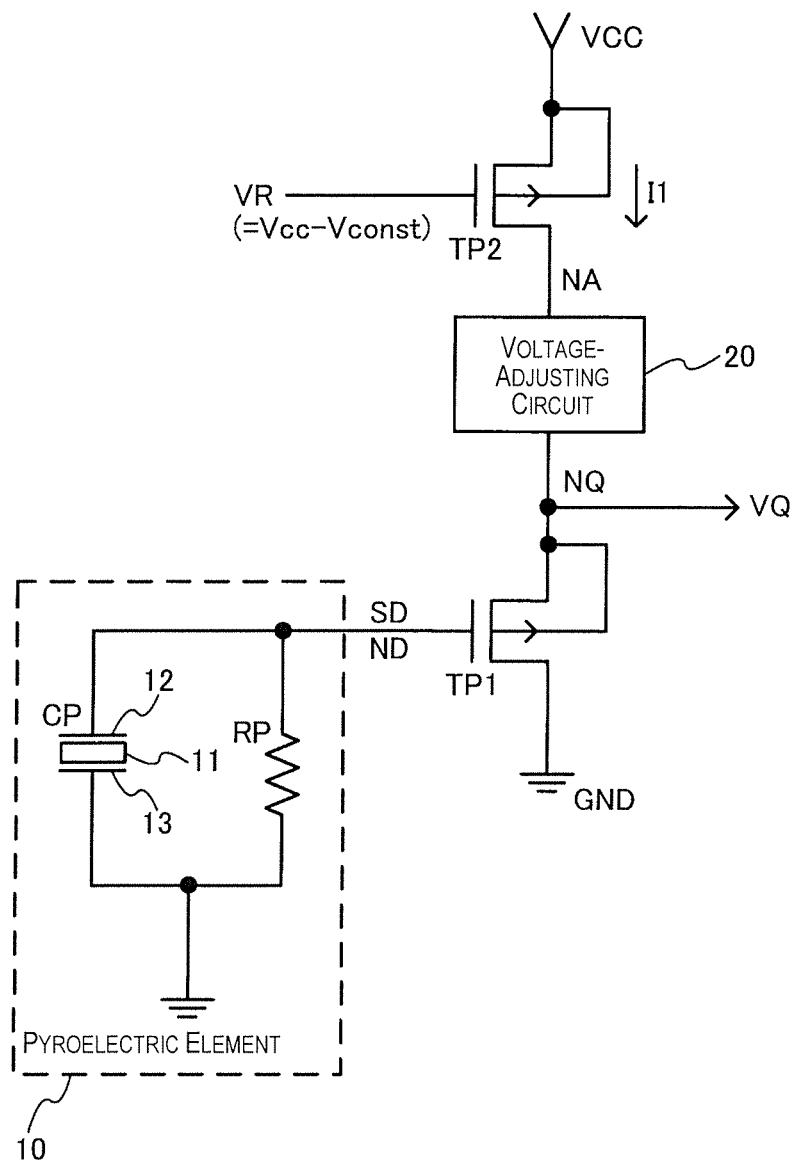
FIG. 6 is a modification of the detection circuit of the present embodiment.

The detection circuit of the present embodiment is not limited to the configuration of FIG. 3, and a variety of modifications are possible. For example, FIG. 6 shows a modified example of the detection circuit of the present embodiment. In this modified example, a voltage-adjusting circuit 20 is further provided to the configuration of FIG. 3.

The voltage-adjusting circuit 20 is made to adjust the drain-source voltage of the P-type transistor TP2 and is provided between the P-type transistor TP2 and the output node NQ. In other words, the voltage-adjusting circuit 20 adjusts the voltage so that the drain-source voltages of the P-type transistors TP1 and TP2 are brought closer together.

Figure 7A:
FIGS. 7A through 7D are example configurations of the voltage-adjusting circuit.
Figure 7B:
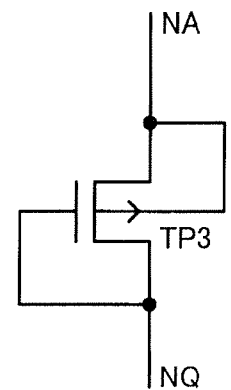
Figure 7C:
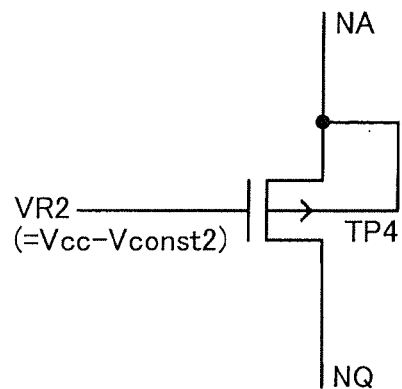
Figure 7D:
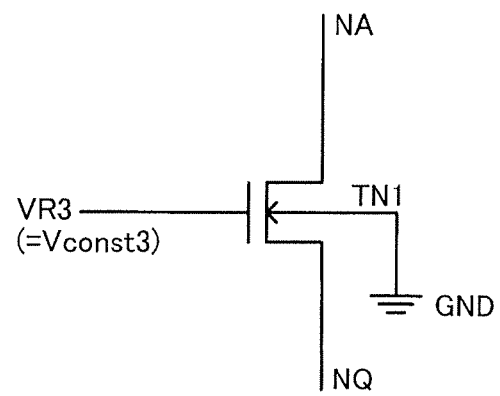

For example, FIGS. 7A through 7D show specific example configurations of the voltage-adjusting circuit 20. In FIG. 7A, the voltage-adjusting circuit 20 provided between nodes NA and NQ is implemented using a resistor RA. In FIG. 7B, the voltage-adjusting circuit 20 is implemented using a diode-connected P-type transistor TP3, in which the source is connected to the node NA, and the gain and the drain are connected to the node NQ. In FIG. 7C, the voltage-adjusting circuit 20 is implemented using a P-type transistor TP4, in which the source is connected to the node NA, the drain is connected to the node NQ, and a reference voltage VR2, which equals Vcc−Vconst2, is inputted to the gate. In FIG. 7D, the voltage-adjusting circuit 20 is implemented using an N-type transistor TN1, in which the drain is connected to the node NA, the source is connected to the node NQ, and a reference voltage VR3, which equals Vconst3, is inputted to the gate. Vconst2 and Vconst3 may be different voltages or the same voltage as Vconst.

Providing the voltage-adjusting circuit 20 as in FIG. 6 allows the source-drain voltages of the transistors TP1 and TP2 to be brought closer together and also allows, e.g., the drain-source voltages to be set to the same value.

If, e.g., the drain-source voltages are the same in the transistors TP1, TP2, the same current I1 will flow to the transistors TP1, TP2, and therefore the gate-source voltages can be made the same for the transistors TP1, TP2. When VR, which equals Vcc−Vconst, is inputted to the gate of the transistor TP2, a voltage of Vconst is always outputted to the output node NQ that is the source of the transistor TP1. In other words, when the voltage of the detection signal SD from the pyroelectric element 10 changes by ΔV, the output voltage VQ of the output node NQ changes by ΔV using Vconst as a reference. Thus, if the output voltage VQ is accurately set to Vconst, the circuit design of the amplifier circuit, the A/D converter, and other subsequent-stage components can be simplified.

Providing the voltage-adjusting circuit 20 allows the difference in element characteristics between the transistors TP1, TP2 to be reduced and allows the element characteristics to be balanced out if the drain-source voltages in the transistors TP1, TP2 are brought closer together, whereby variation in the output voltage VQ can further be reduced.

Figure 8:
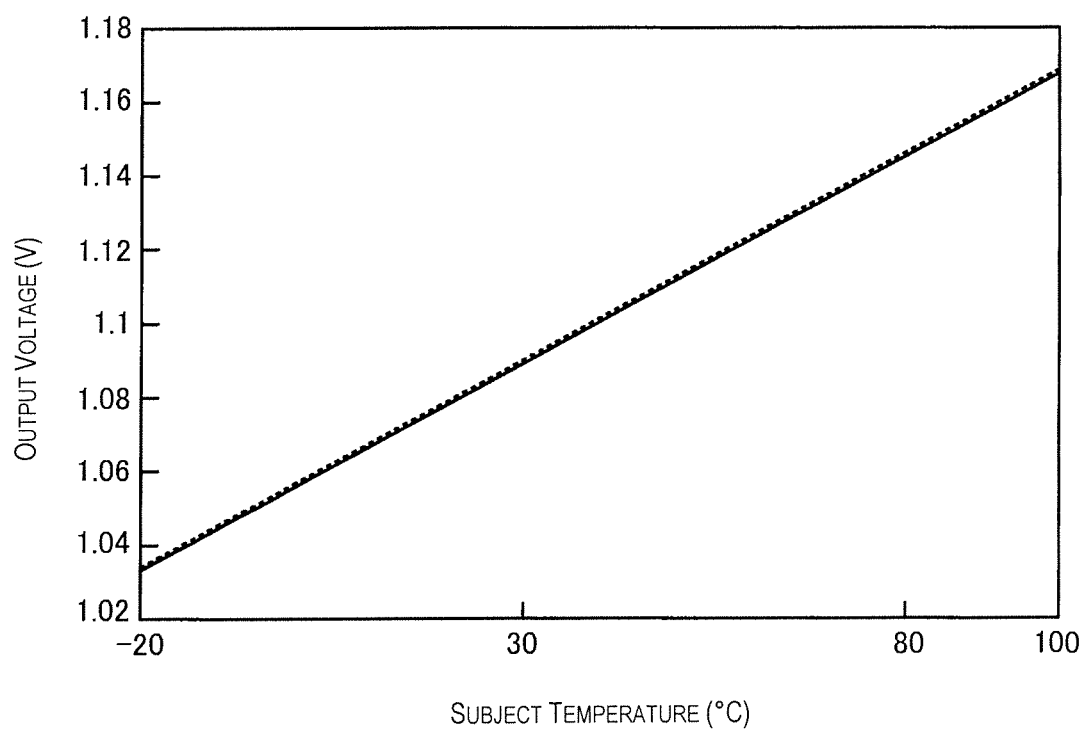
FIG. 8 is a characteristic example of subject temperature versus output voltage in the detection circuit of the modification.

For example, FIG. 8 shows a characteristic example of subject temperature versus output voltage when the detection circuit of FIG. 6 is employed. Similar to FIGS. 2 and 5, four plots are obtained in FIG. 8 for the characteristics of the output voltage of the detection circuit when the characteristics of the transistors TP1, TP2, and the like vary within general IC manufacturing standards (cases 1 through 4).

As is made clear from comparing FIG. 8 and FIG. 5, if the voltage-adjusting circuit 20 is provided as shown in FIG. 6, the fluctuating variations of the output voltage VQ can be further reduced, and the precision of temperature detection and the like using the detection circuit can be further improved.

4. Sensor Device

Figure 9A:
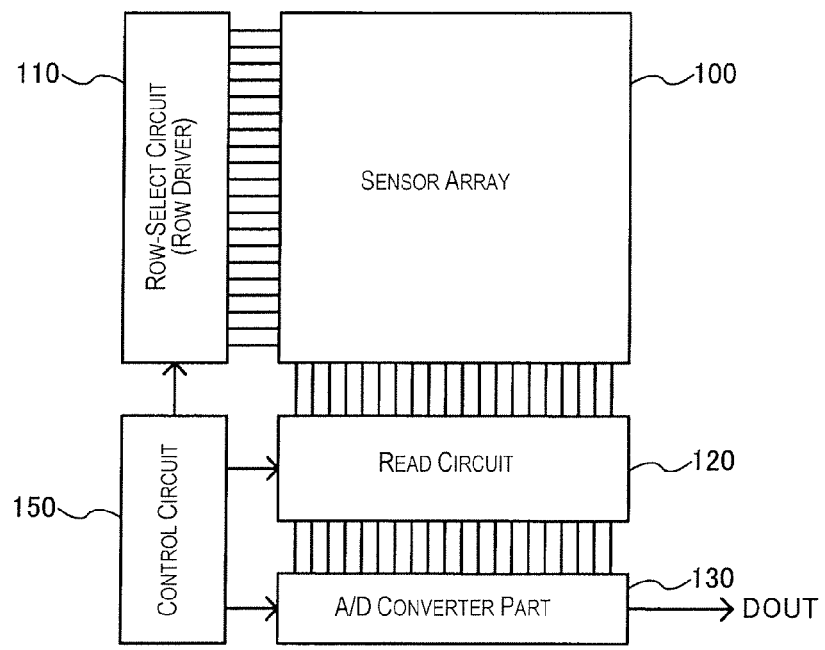
FIGS. 9A and 9B are example configurations of the sensor device.

FIG. 9 shows an example configuration of a sensor device of the present embodiment. The sensor device includes a sensor array 100, a row-select circuit (row driver) 110, and a read circuit 120. An A/D converter part 130 and a control circuit 150 can also be included. Using this sensor device makes it possible to implement, e.g., an infrared camera or the like for use in night-vision devices and the like A plurality of sensor cells are arrayed (positioned) in the sensor array 100 (focal plane array). A plurality of row lines (word lines, scanning lines) and a plurality of column lines (data lines) are provided. The number of column lines may also be one. When one column line is present, a line sensor on which a plurality of sensor cells are arrayed along the column line (the vertical direction) is configured.

Figure 9B:
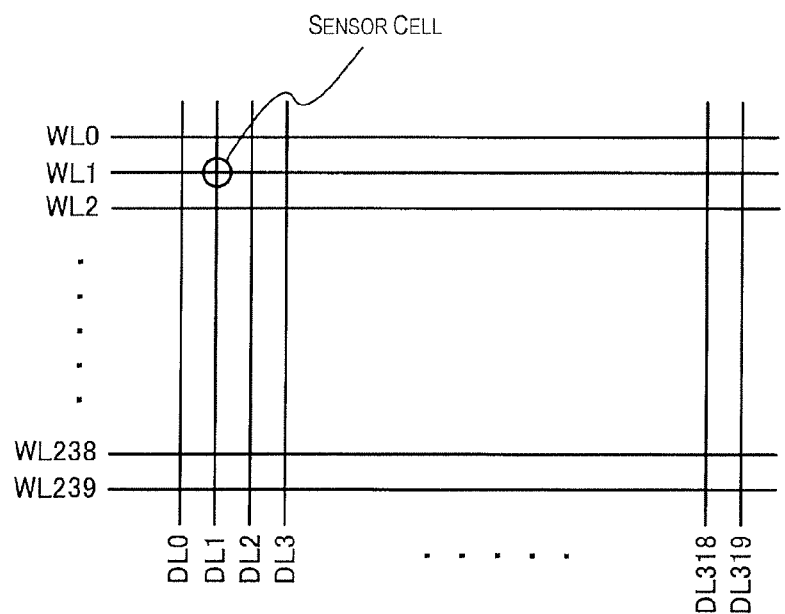

The sensor cells of the sensor array 100 are positioned (formed) at locations corresponding to intersections between the row lines and the column lines. For example, the sensor cell of FIG. 9B is positioned at a location corresponding to the intersection between row line WL1 and column line DL1. The case is the same for other sensor cells.

The row-select circuit 110 connects to one or a plurality of row lines and performs operations for selecting row lines. For example, if the QVGA (320×240 pixels) sensor array 100 (focal plane array) such as the one shown in FIG. 9B is taken as an example, operations are performed for sequentially selecting (scanning) row lines WL0, WL1, WL2 ... WL239. In other words, a signal for selecting the row lines (a word-select signal) is outputted to the sensor array 100.

The read circuit 120 connects to a plurality of column lines and performs operations for reading the column lines. If the QVGA sensor array 100 is taken as an example, operations are performed for reading detection signals (detection current, detection charge) from column lines DL0, DL1, DL2 ... DL319. The read circuit 120 is provided with, e.g., amplifier circuits that correspond to respective column lines among the plurality of column lines. The amplifier circuits amplify the signals of the corresponding column lines.

The A/D converter part 130 performs A/D conversion to convert the detection voltage (measurement voltage, ultimate voltage) acquired in the read circuit 120 to digital data. Digital data DOUT that has been subjected to A/D conversion is outputted. Specifically, the A/D converter part 130 is provided with A/D converters corresponding to respective column lines among the plurality of column lines. The A/D converters perform A/D conversion on the detection voltages acquired by the read circuit 120 for the corresponding column lines. One A/D converter is provided to correspond to a plurality of column lines, and this single A/D converter may be used to perform A/D conversion on the detection voltages of the plurality of column lines in a time-divided fashion. The configuration may also be such that the amplifier circuits of the read circuit 120 are not provided, and the signals of the column lines are inputted directly to the A/D converters of the A/D converter part 130.

The control circuit 150 (timing-generating circuit) generates a variety of control signals and outputs to the row-select circuit 110, the read circuit 120, and the A/D converter part 130. The control circuit generates and outputs, e.g., signals and the like for controlling the timing of the circuits.

Figure 10:
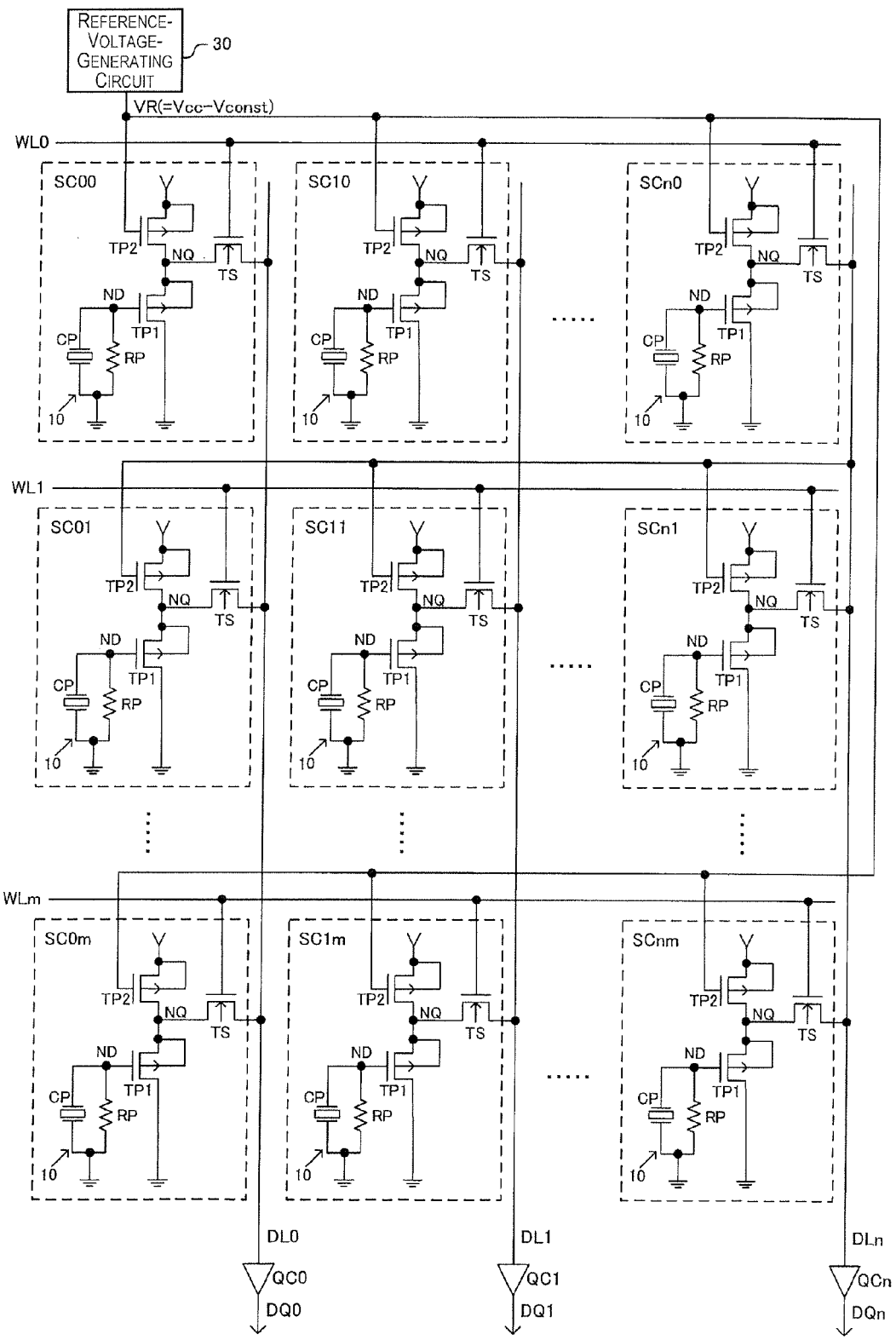
FIG. 10 is a first detailed example configuration of the sensor device.

FIG. 10 shows the details of a first example configuration of the sensor device of the present embodiment. The detailed configuration of the sensor array 100 in particular is shown in FIG. 10.

In FIG. 10, SC00 through SCnm are sensor cells positioned in an array. WL0 through WLm are row lines (row-select lines), and DL0 through DLn are column lines (column-data lines). QC0 through QCn are the amplifier circuits connected to the column lines DL0 through DLn. The amplifier circuits output signals resulting from amplifying the voltages of the column lines DL0 through DLn, where these outputted signals are DQ0 through DQn. QC0 through QCn may also be the A/D converters for performing A/D conversion directly on the voltages of the column lines DL0 through DLn.

Each of the sensor cells among the plurality of sensor cells SC00 through SCnm includes the pyroelectric element 10 and the first and second P-type transistors TP1, TP2, as well as a row-select transistor TS.

The first P-type transistor TP1 is provided between the output node NQ for the corresponding column line that corresponds to the respective sensor cell, and the GND node (low-potential-side power node). The detection signal from the pyroelectric element 10 is inputted to the gate of TP1.

The second P-type transistor TP2 is provided between the VCC node (high-potential-side power node) and the output node NQ. The gate of TP2 is set to the reference voltage VR (Vcc−Vconst). The reference voltage VR is generated by a reference-voltage-generating circuit 30 and is supplied to the sensor cells SC00 through SCnm.

The row-select transistor TS is provided between the output node NQ and the corresponding column line of the respective sensor cell. The corresponding row line that corresponds to the respective sensor cell is connected to the gate of TS. Each of the sensor cells among the plurality of sensor cells provided to correspond to the corresponding column line is connected to the corresponding column line via the row-select transistor TS. In other words, the row-select transistor TS of each of the sensor cells is connected to the corresponding row line from among the row lines WL0 through WLm that corresponds to that sensor cell. Bringing the corresponding row line to, e.g., H level turns on the row-select transistor TS and connects the output node NQ of the sensor cell and the corresponding column line of the sensor cell.

For example, the sensor cells SC00 through SC0m are connected to the corresponding column line DL0 for SC00 through SC0m. Specifically, the output node NQ of each of the sensor cells of SC00 through SC0m is connected to the corresponding column line DL0 via the row-select transistor TS. In the same way, the sensor cells SC10 through SC1m are connected to the corresponding column line DL1 of SC10 through SC1m. Specifically, the output node NQ of each of the sensor cells of SC00 through SC0m is connected to the corresponding column line DL1 via the row-select transistor TS. The case is the same for the other sensor cells SCn0 through SCnm.

The row-select transistors TS of the sensor cells SC00, SC10 . . . SCn0 provided to correspond to the row line WL0 turn on when the row line WL0 reaches H level. At this point, the output nodes NQ of the sensor cells SC00, SC10 . . . SCn0 are connected to the respective corresponding column lines DL0, DL1 . . . DLn. The signals are thereby read from the sensor cells SC00, SC10 . . . SCn0, outputted to the corresponding column lines DL0, DL1 . . . DLn, amplified by the amplifier circuits QC0 through QCn, and outputted as signals DQ0 through DQn.

The row-select transistors TS of the sensor cells SC01, SC11 . . . SCn1 provided to correspond to the row line WL1 turn on when the row line WL1 reaches H level. The output nodes NQ of the sensor cells SC01, SC11 . . . SCn1 are thereby connected to the respective corresponding column lines DL0, DL1 . . . DLn. The signals are thereby read from the sensor cells SC01, SC11 . . . SCn1, outputted to the corresponding column lines DL0, DL1 . . . DLn, amplified by the amplifier circuits QC0 through QCn, and outputted as signals DQ0 through DQn. The operation of the sensor cells connected to the other row lines WLm is the same.

According to the first example configuration of FIG. 10, the two P-type transistors TP1, TP2 are provided to each of the sensor cells, and therefore the area occupied by the transistors in each of the sensor cells increases. However, there are cases in which, e.g., the transistors are formed below or the like relative to the pyroelectric element 10 configured from a ferroelectric film or the like, and the area occupied by the pyroelectric element 10 is larger than the area occupied by the transistors. Significant problems are not presented in such cases even when the P-type transistors TP1, TP2 are provided to each of the sensor cells, as in FIG. 10.

On the other hand, according to the methods for providing the P-type transistors TP1, TP2 to the sensor cells as in FIG. 10, the manufacturing conditions and other characteristics of the P-type transistors TP1, TP2 can be made equivalent. Advantages are therefore presented in that the threshold voltages and other circuit characteristics of TP1, TP2 can be made substantially the same, and variation in the output voltage can be further reduced.

Figure 11:
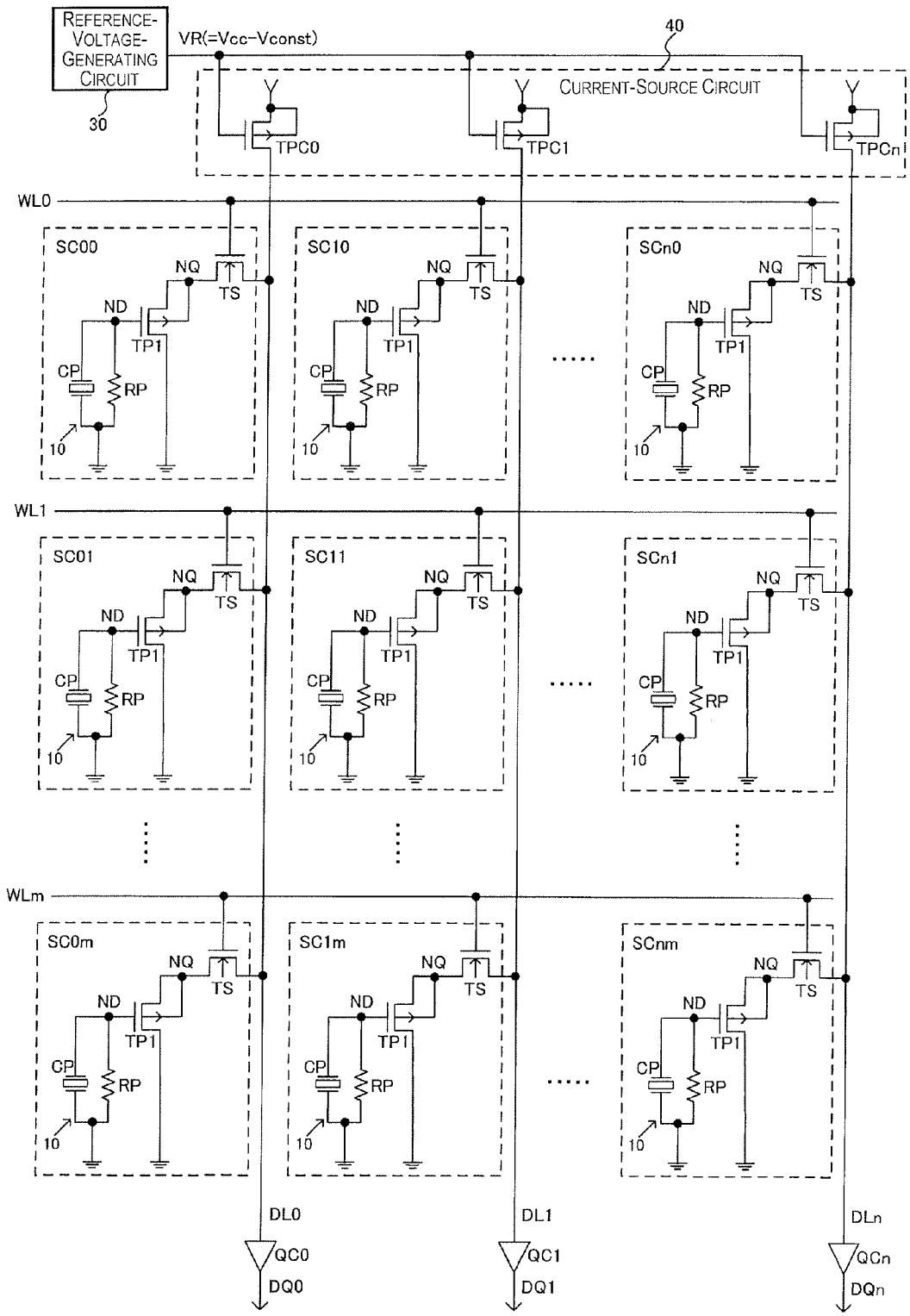
FIG. 11 is a second detailed example configuration of the sensor device.

FIG. 11 shows the details of a second example configuration of the sensor device of the present embodiment. The second example configuration of FIG. 11 has a different configuration of sensor cells than the first example configuration of FIG. 10. A current-source circuit 40 that is connected to the row lines DL0 through DLn is further provided in FIG. 11.

Each of the sensor cells of SC00 through SCnm includes the pyroelectric element 10 and the first P-type transistor TP1. The first P-type transistor TP1 is provided between the output node NQ for the corresponding column line that corresponds to the respective sensor cell, and the GND node (low-potential-side power node). The detection signal from the pyroelectric element 10 is inputted to the gate of TP1.

Each of the sensor cells of SC00 through SCnm includes the row-select transistor TS. The row-select transistor TS is provided between the output node NQ and the corresponding column line of the respective sensor cell. The corresponding row line that corresponds to the respective sensor cell is connected to the gate of TS. In other words, the row-select transistor TS of each of the sensor cells is connected to the corresponding row line from among the row lines WL0 through WLm that corresponds to that sensor cell. Bringing the corresponding row line to, e.g., H level turns on the row-select transistor TS and connects the output node NQ of the sensor cell and the corresponding column line of the sensor cell.

The current-source circuit 40 includes second P-type transistors TPC0 through TPCn. The second P-type transistors TPC0 through TPCn correspond to the second P-type transistor TP2 of FIG. 3. In other words, each of the P-type transistors of TPC0 through TPCn in FIG. 11 is shared as the second P-type transistor of the sensor cell connected to the corresponding column line. The source follower circuit is configured from the P-type transistors of TPC0 through TPCn of the current-source circuit 40 and the P-type transistors TP1 of the sensor cell.

The plurality of P-type transistors TPC0 through TPCn are provided to the current-source circuit 40 in FIG. 11, but in the case of a line sensor having one column line, one second P-type transistor that is connected to the single column line may be provided.

The P-type transistors of TPC0 through TPCn are provided between the VCC node and the corresponding column line. The gate is set to the reference voltage VR(=Vcc−Vconst), and a current (set current) is supplied to each of the sensor cells of SC00 through SCnm via the corresponding column lines. For example, the P-type transistor TPC0 is provided between the VCC node and the corresponding column line DL0, and current is supplied to the sensor cells SC00 through SC0m of the corresponding column line DL0. The P-type transistor TPC1 is provided between the VCC node and the corresponding column line DL1, and current is supplied to the sensor cells SC10 through SC1m of the corresponding column line DL1. The case is the same for the other P-type transistors TPCn.

For example, the row-select transistors TS of the sensor cells SC00, SC10 ... SCn0 provided to correspond to the row line WL0 turn on when the row line WL0 reaches H level. At this point, the output nodes NQ of the sensor cells SC00, SC10 ... SCn0 are connected to the respective corresponding column lines DL0, DL1 DLn. The set current from the P-type transistors TPC0 through TPCn of the current-source circuit 40 is thereby made to flow to the P-type transistors TP1 of the sensor cells SC00, SC10 ... SCn0, and an operation identical to that of the detection circuit of FIG. 3 is implemented. The signals are read from the sensor cells SC00, SC10 ... SCn0, outputted to the corresponding column lines DL0, DL1 DLn, amplified by the amplifier circuits QC0 through QCn, and outputted as signals DQ0 through DQn. The operation of the sensor cells SC01 through SCnm that are connected to the row lines WL1 through WLm is the same.

According to the second example configuration of FIG. 11, the second P-type transistors TPC0 through TPCn are shared by a plurality of detection circuits. Therefore, it is sufficient to provide a single P-type transistor TP1 to each of the sensor cells, and therefore the area occupied by transistors in each of the sensor cells can be reduced in comparison with the first example configuration of FIG. 10. However, the P-type transistors TP1 and TPC0 through TPCn are laid out in positions that are far apart in comparison with the first example configuration of FIG. 10. There is therefore a possibility of variations in the manufacturing conditions or other characteristics of the P-type transistors TP1 and TPC0 through TPCn, and the possibility that variation in the output voltages will increase more so than in the first example configuration of FIG. 10.

5. Layout

FIGS. 12A through 13C show example layouts of the first P-type transistor TP1 and the second P-type transistors TP2, TPC (TPC0 through TPCn).

Figure 12A:
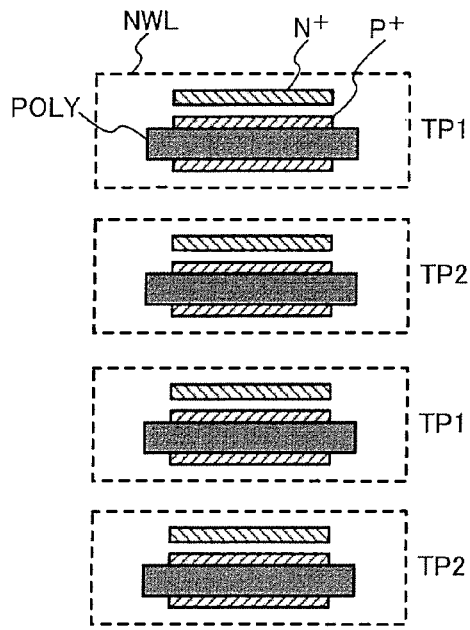
FIGS. 12A through 12C are examples of the layout of the first and second P-type transistors.
Figure 12B:
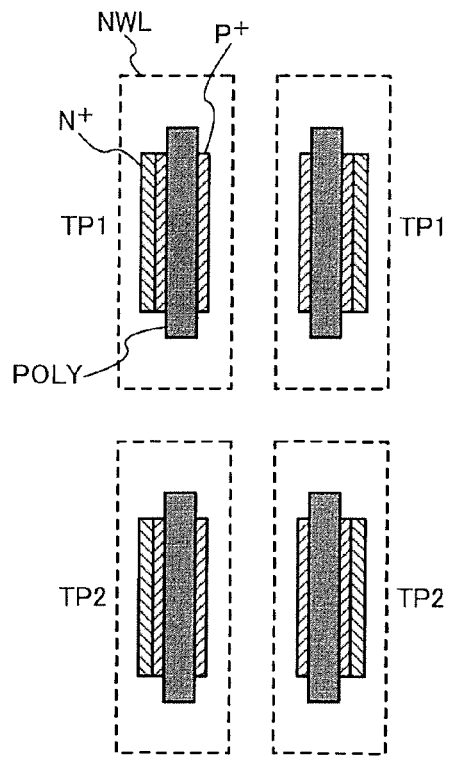
Figure 12C:
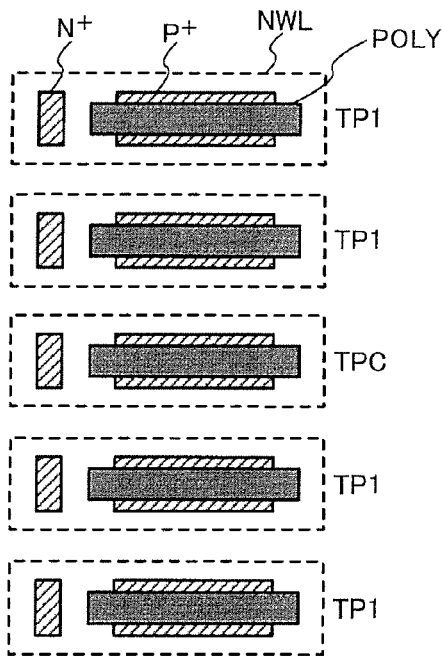

FIGS. 12A through 12C are example layouts for the case in which the substrate potentials of the first and second P-type transistors TP1, TP2 (TPC) are set to the source potentials, as in FIG. 3. NWL is an N-well region, N+ is an N-type diffusion region, P+ is a P-type diffusion region, and POLY is polysilicon wiring that forms the gates.

The N-type well NWL that is formed by the P-type transistor TP1 is set to the source potential of TP1 via the N-type diffusion region N+. In other words, the N-type well NWL formed by TP1 is electrically connected to the output node NQ of FIG. 3. On the other hand, the N-type well NWL formed by the P-type transistor TP2 (TPC) is set to the source potential of TP2 (TPC) via the N-type diffusion region N. In other words, the N-type well NWL formed by TP2 (TPC) is electrically connected to the VCC node.

The N-type wells NWL are thus divided off and formed for each of the P-type transistors TP1, TP2 (TPC) in FIGS. 12A through 12C, and therefore the substrate potentials of the P-type transistors TP1, TP2 (TPC) can be set to the source potentials thereof. Fluctuations in threshold voltages due to substrate bias effects can therefore be prevented, and the threshold voltages of TP1 and TP2 (TPC) can be brought closer together.

FIGS. 12A, 12B are example layouts of the first example configuration of FIG. 10. The first and second P-type transistors TP1, TP2 provided to each of the sensor cells of FIG. 10 are laid out in an adjoining fashion in FIGS. 12A, 12B. In other words, TP1 and TP2 are positioned without other circuit elements therebetween. TP1 and TP2 may also be, e.g., laid out adjoining the P-type transistors TP1, TP2 of neighboring sensor cells.

FIG. 12C is an example layout of the second example configuration of FIG. 11. The first P-type transistors TP1 provided to each of the sensor cells of FIG. 11, and the second P-type transistors TPC (TPC0 through TPCn) provided to the current-source circuit 40 are laid out in an adjoining fashion. TP1 and TPC may also be, e.g., laid out adjoining the P-type transistors TP1 of neighboring sensor cells.

Figure 13A:
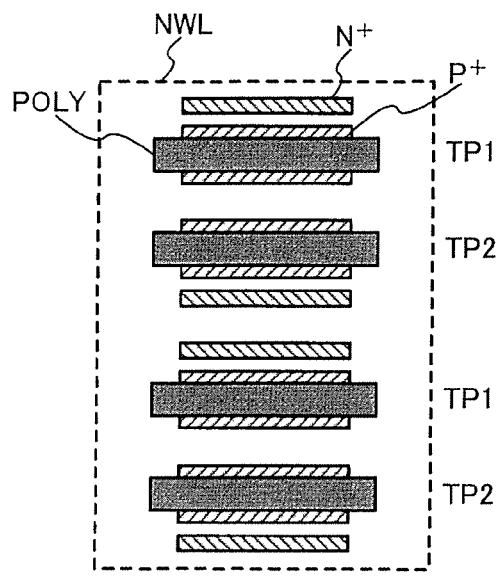
FIGS. 13A through 13C are examples of the layout of the first and second P-type transistors.
Figure 13B:
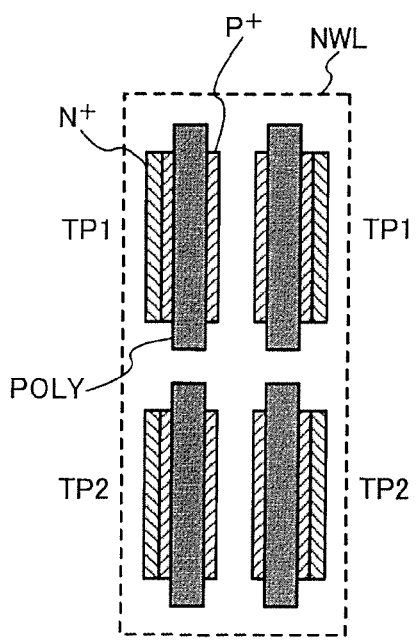
Figure 13C:
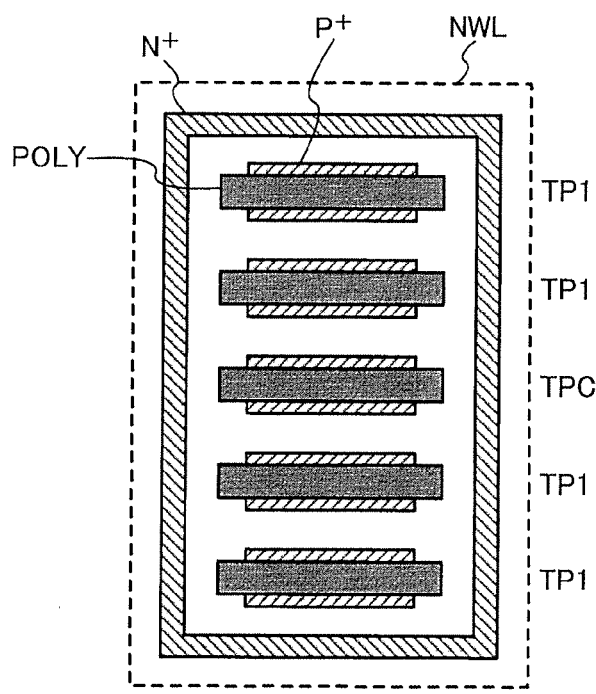

FIGS. 13A through 13C are example layouts for the case in which the substrate potentials of the first and second P-type transistors TP1, TP2 are set to the potential of the high-potential-side power source VCC.

A shared N-type well NWL is formed by all of the P-type transistors TP1, TP2 (TPC) in FIGS. 13A through 13C. This N-type well NWL is set to the potential of VCC via the N-type diffusion region N+. As opposed to FIGS. 12A through 12C, fluctuations in threshold voltage do occur in this layout due to substrate bias effects, but the layout surface area can also be reduced.

Layouts of the P-type transistors TP1, TP2 (TPC) of the present embodiment are not limited to FIGS. 12A through 13C. A variety of modifications are possible in, e.g., the positioning locations, positioning directions, and size of the transistors, as well as in the positioning locations, positioning directions, and size of the N-well regions, the N-type diffusion regions N+, and the P-type diffusion regions P+.

6. Electronic Apparatus

Figure 14:
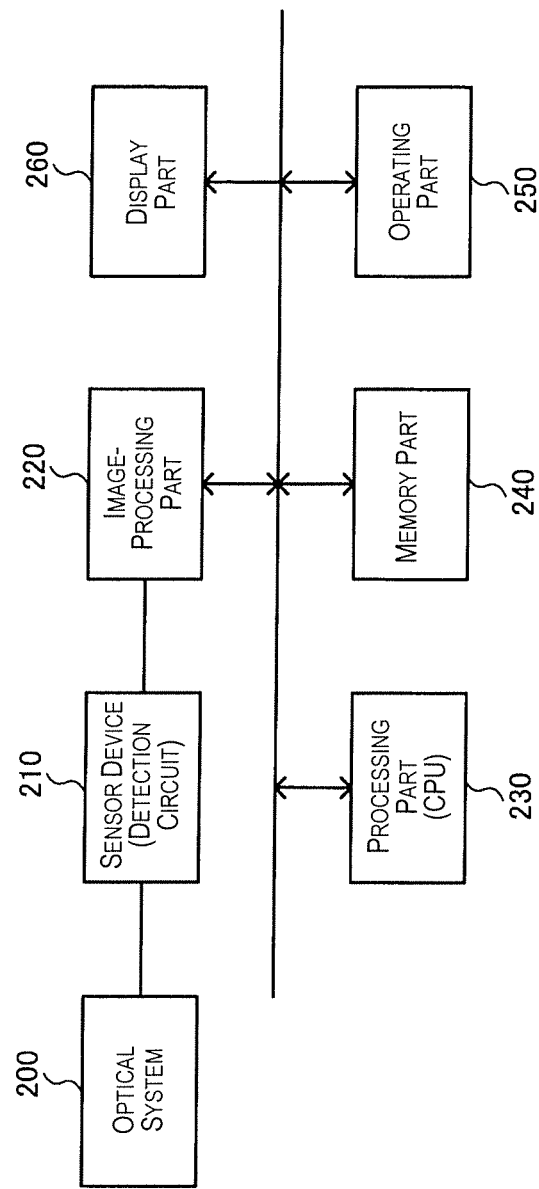
FIG. 14 is an example configuration of the electronic apparatus of the present embodiment.

FIG. 14 shows an example configuration of an electronic apparatus that includes the sensor device and the detection circuit of the present embodiment. This electronic apparatus includes an optical system 200, a sensor device 210 (detection circuit), an image-processing part 220, a processing part 230, a memory part 240, an operating part 250, and a display part 260. The electronic apparatus of the present embodiment is not limited to the configuration of FIG. 14, and a portion of the constituent elements (e.g., the optical system, operating part, or display part) may be omitted, other constituent elements may be added, and a variety of other modifications are possible.

The optical system 200 includes, e.g., one or a plurality of lenses and a driving part for driving the lenses. The optical system performs operations such as fowling an image of an object on the sensor device 210. The optical system also adjusts the focus and the like if necessary.

The sensor device 210 is described in FIGS. 9A through 11 and the like, and is made to fowl images of objects. The image-processing part 220 performs image correction and various other types of image processing on the basis of digital image data (pixel data) from the sensor device 210. The detection circuit described in FIGS. 3, 6, and the like may also be used instead of the sensor device 210 that acts as the image sensor.

The processing part 230 controls the electronic apparatus overall and controls the blocks within the electronic apparatus. The processing part 230 is implemented as, e.g., a CPU. The memory part 240 stores various types of information and functions as, e.g., a work area for the processing part 230 and the image-processing part 220. The operating part 250 is an interface for a user to operate the electronic apparatus and is implemented using, e.g., various types of buttons and a GUI (graphical user interface) screen. The display part 260, e.g., displays the image acquired by the sensor device 210, the GUI screen, and other information, and is implemented using a liquid-crystal display, an organic electroluminescent display, or another of various types of displays or projection-displaying devices.

The present embodiment can be applied to electronic apparatuses in which infrared cameras are used, and to infrared cameras in which FPAs (focal plane arrays) are used. Examples of electronic apparatuses in which an infrared camera is applied could include navigation apparatuses for forming images of objects in the dark, thermographic apparatuses for acquiring temperature distributions of an object, intrusion-detecting devices for detecting human intrusion, analytic apparatuses (measuring apparatuses) for analyzing (measuring) the physical information of an object, security apparatuses for detecting fire and heat generation, and FA (factory automation) apparatuses provided to factories and the like. If the navigation apparatus is applied to a vehicle-mounted apparatus, images of people and the like can be detected and displayed when the vehicle is traveling in the dark. If the apparatus is applied to a thermographic apparatus, the apparatus can be used for influenza quarantine and the like.

The present embodiment was described in detail above, but the fact that many modifications are possible that do not substantially depart from the new matter and effects of the present invention can be easily understood by a person of ordinary skill in the art. Such modified examples are therefore all included in the scope of the present invention. For example, terms (VCC node, GND node, and the like) that are mentioned at least once together with different terms that are broader or identical in meaning (high-potential-side power node, low-potential-side power node) in the specification and drawings can be substituted with those different terms at any location in the specification and drawings. The configurations and operation of the detection circuit, the sensor device, and the electronic apparatus are also not limited to the descriptions of the present embodiment, and a variety of modifications are possible.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A detection circuit comprising:
   a pyroelectric element;
   a first P-type transistor provided between an output node and a low-potential-side power node of the detection circuit so that a detection signal is inputted from the pyroelectric element to a gate of the first P-type transistor;
   a second P-type transistor provided between a high-potential-side power node and the output node, a gate of the second P-type transistor being set to a reference voltage; and
   a voltage-adjusting circuit configured and arranged to adjust a drain-source voltage of the second P-type transistor, the voltage-adjusting circuit being provided between the second P-type transistor and the output node.

2. The detection circuit as recited in claim 1, wherein
   a substrate potential of the first P-type transistor is set to a potential of a source of the first P-type transistor, and
   a substrate potential of the second P-type transistor is set to a potential of a source of the second P-type transistor.

3. A sensor device comprising the detection circuit as recited in claim 2.

4. The detection circuit as recited in claim 1, wherein
   at least one of a gate length and a gate width is the same for the first P-type transistor and the second P-type transistor.

5. A sensor device comprising the detection circuit as recited in claim 4.

6. The detection circuit of claim 1, wherein
   the first P-type transistor and the second P-type transistor are laid out to be adjacent to each other.

7. A sensor device comprising the detection circuit as recited in claim 6.

8. The detection circuit as recited in claim 1, wherein
   the second P-type transistor is shared with a detection circuit for another pyroelectric element.

9. A sensor device comprising the detection circuit as recited in claim 8.

10. The detection circuit as recited in claim 1, wherein
    a high-potential-side power voltage Vcc is supplied to the high-potential-side power node,
    a voltage of the gate of the second P-type transistor is set to a value obtained by subtracting a voltage Vconst from the high-potential-side power voltage Vcc (Vcc−Vconst) as the reference voltage, and
    the first P-type transistor is configured and arranged to output a voltage to the source, the voltage outputted from the first P-type transistor changing according to a voltage change of the detection signal from the pyroelectric element with a set voltage corresponding to the voltage Vconst being used as a reference.

11. The detection circuit as recited in claim 10, wherein
    $Vth \leq Vconst \leq Vcc - Vth$, where Vth is a threshold voltage of the first P-type transistor.

12. A sensor device comprising the detection circuit as recited in claim 10.

13. A sensor device comprising the detection circuit as recited in claim 1.

14. An electronic apparatus comprising the sensor device as recited in claim 13.

15. An electronic apparatus comprising the detection circuit as recited in claim 1.

16. The detection circuit as recited in claim 1, wherein
the voltage-adjusting circuit is configured and arranged to adjust the drain-source voltage of the second P-type transistor so that the drain-source voltage of the second P-type transistor and a drain-source voltage of the first P-type transistor are brought closer together.

17. A sensor device comprising:
a sensor array having a plurality of sensor cells that are arrayed;
a plurality of row lines;
one or more column lines;
a row-select circuit connected to the row lines; and
a read circuit connected to the one or more column lines,
each of the sensor cells having
 a pyroelectric element,
 a first P-type transistor provided between a low-potential-side power node and an output node for a corresponding one of the one or more column lines so that a detection signal is inputted from the pyroelectric element to a gate of the first P-type transistor,
 a second P-type transistor provided between a high-potential-side power node and the output node, a gate of the second P-type transistor being set to a reference voltage; and
 a voltage-adjusting circuit configured and arranged to adjust a drain-source voltage of the second P-type transistor, the voltage-adjusting circuit being provided between the second P-type transistor and the output node.

18. The sensor device as recited in claim 17, wherein
each of the sensor cells includes a row-select transistor provided between the output node and the corresponding one of the one or more column lines with a gate of the row-select transistor being connected to a corresponding one of the row lines, and
each of the sensor cells among the sensor cells provided to correspond to the corresponding one of the one or more column lines is connected to the corresponding one of the one or more column lines via the row-select transistor.

19. The sensor as recited in claim 15, wherein
the voltage-adjusting circuit is configured and arranged to adjust the drain-source voltage of the second P-type transistor so that the drain-source voltage of the second P-type transistor and a drain-source voltage of the first P-type transistor are brought closer together.

20. A sensor device comprising:
a sensor array having a plurality of sensor cells that are arrayed;
a plurality of row lines;
one or more column lines;
a row-select circuit connected to the row lines;
a read circuit connected to the one or more column lines; and
a current-source circuit connected to the one or more column lines,
each of the sensor cells having
 a pyroelectric element, and
 a first P-type transistor provided between a low-potential-side power node and an output node for a corresponding one of the one or more column lines so that a detection signal is inputted from the pyroelectric element to a gate of the first P-type transistor, and
the current-source circuit having a second P-type transistor configured and arranged to supply current to each of the sensor cells via the corresponding one of the one or more column lines, the second P-type transistor being provided between a high-potential-side power node and the output node, and a gate of the second P-type transistor being set to a reference voltage.

21. The sensor device as recited in claim 20, wherein
each of the sensor cells includes a row-select transistor provided between the output node and the corresponding one of the one or more column lines with a gate of the row-select transistor being connected to a corresponding one of the row lines, and
each of the sensor cells among the sensor cells provided to correspond to the corresponding one of the one or more column lines is connected to the corresponding one of the one or more column lines via the row-select transistor.

* * * * *